United States Patent
Han et al.

(10) Patent No.: US 11,197,369 B2
(45) Date of Patent: Dec. 7, 2021

(54) CAMERA MODULE AND VEHICLE CAMERA

(71) Applicant: LG INNOTEK CO., LTD., Seoul (KR)

(72) Inventors: Sang Yeal Han, Seoul (KR); Min Woo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/329,137

(22) PCT Filed: Aug. 31, 2017

(86) PCT No.: PCT/KR2017/009573
§ 371 (c)(1),
(2) Date: Feb. 27, 2019

(87) PCT Pub. No.: WO2018/044108
PCT Pub. Date: Mar. 8, 2018

(65) Prior Publication Data
US 2019/0208626 A1     Jul. 4, 2019

(30) Foreign Application Priority Data

Sep. 2, 2016  (KR) .................. 10-2016-0113137

(51) Int. Cl.
*H05K 1/02* (2006.01)
*H05K 1/18* (2006.01)
(Continued)

(52) U.S. Cl.
CPC .......... *H05K 1/0271* (2013.01); *G02B 7/02* (2013.01); *G03B 17/02* (2013.01); *G03B 17/12* (2013.01);
(Continued)

(58) Field of Classification Search
CPC .................. G02B 7/02; H05K 2201/10515
See application file for complete search history.

(56) References Cited

U.S. PATENT DOCUMENTS 3,066,367 A * 12/1962 Garman ............... H02B 1/015
                                                          248/222.11
5,673,172 A *  9/1997 Hastings ............. G06F 1/182
                                                          361/679.34
(Continued)

FOREIGN PATENT DOCUMENTS

CN        1874423 A     12/2006
CN      101441309 A      5/2009
(Continued)

OTHER PUBLICATIONS

Supplementary Partial European Search Report dated Oct. 10, 2019 in European Application No. 17847033.2.
(Continued)

*Primary Examiner* — Noam Reisner
(74) *Attorney, Agent, or Firm* — Saliwanchik, Lloyd & Eisenschenk

(57) ABSTRACT

A camera module comprises: a lens barrel disposed in a front body and comprising a lens; a first substrate disposed under the body; a support member partially disposed on an undersurface of the first substrate; and a second substrate disposed under the first substrate and coupled to the support member, wherein the support member comprises: a fence portion disposed between the first substrate and the second substrate; and a hook portion which comprises a region extending from the fence portion and having a coupling hole into which a partial side surface of the second substrate is inserted, and an extended portion inclined at a predetermined angle with respect to the region having the coupling hole formed therethrough.

20 Claims, 12 Drawing Sheets

(51) Int. Cl.
  *G03B 17/02* (2021.01)
  *H05K 1/14* (2006.01)
  *H01R 12/52* (2011.01)
  *H04N 5/225* (2006.01)
  *G02B 7/02* (2021.01)
  *G03B 17/12* (2021.01)

(52) U.S. Cl.
  CPC ........... *H04N 5/225* (2013.01); *H04N 5/2251* (2013.01); *H05K 1/028* (2013.01); *H05K 1/144* (2013.01); *H05K 1/18* (2013.01); *G03B 2217/002* (2013.01); *H01R 12/52* (2013.01); *H05K 2201/042* (2013.01); *H05K 2201/10121* (2013.01)

(56) References Cited

U.S. PATENT DOCUMENTS

| | | | |
|---|---|---|---|
| 6,359,652 B1 | 3/2002 | Takada | |
| 2011/0279675 A1* | 11/2011 | Mano | G02B 13/001 348/148 |
| 2015/0189137 A1* | 7/2015 | Han | B60R 11/04 348/374 |
| 2017/0339323 A1* | 11/2017 | Drotleff | H04N 5/2254 |

FOREIGN PATENT DOCUMENTS

| | | |
|---|---|---|
| CN | 102611838 A | 7/2012 |
| CN | 103703626 A | 4/2014 |
| CN | 103930309 A | 7/2014 |
| CN | 104765223 A | 7/2015 |
| EP | 1781020 A1 | 5/2007 |
| JP | 2006-327512 A | 12/2006 |
| JP | 2006-327514 A | 12/2006 |
| JP | 2008-35215 A | 2/2008 |
| JP | 2011-139305 A | 7/2011 |
| JP | 2011-191328 A | 9/2011 |
| JP | 2011-259101 A | 12/2011 |
| JP | 2015-122718 A | 7/2015 |
| KR | 10-2013-0050767 A | 5/2013 |
| KR | 10-2015-0090661 A | 8/2015 |
| KR | 10-2016-0016107 A | 2/2016 |

OTHER PUBLICATIONS

International Search Report dated Dec. 5, 2017 in International Application No. PCT/KR2017/009573.
Office Action dated Aug. 14, 2020 in Chinese Application No. 201780053469.3.
Office Action dated Aug. 24, 2021 in Japanese Application No. 2019-511851.

* cited by examiner

CAMERA MODULE AND VEHICLE CAMERA

CROSS-REFERENCE TO RELATED APPLICATIONS

This application is the U.S. national stage application of International Patent Application No. PCT/KR2017/009573, filed Aug. 31, 2017, which claims the benefit under 35 U.S.C. § 119 of Korean Application No. 10-2016-0113137, filed Sep. 2, 2016, the disclosures of each of which are incorporated herein by reference in their entirety.

TECHNICAL FIELD

The present invention relates to a camera module and a vehicle camera.

BACKGROUND ART

In recent years, vehicles equipped with rear cameras have been manufactured and sold in order to secure driver's rear view of the vehicle when a vehicle is moving backward. Meanwhile, in recent years, a structure has been studied wherein a plurality of substrates disposed inside the camera module of a vehicle camera is provided for stacking. However, when a plurality of substrates is fixed with screws, there is a problem in that the screw-coupled area of the substrate becomes a useless area, thereby reducing the component mounting space. In addition, there is a problem in that the manufacturing process time is increased due to the screw coupling work. Also, there is a problem in that warping in the substrate may occur due to an excessive torque at the time of screw tightening.

DISCLOSURE

Technical Problem

An objective of the present exemplary embodiment is to provide a camera module wherein reduction of component mounting space in a stacked structure of a plurality of substrates is minimized.

Another objective of the present exemplary embodiment is to provide a camera module capable of minimizing process time by using a hook coupling structure that simplifies the process.

Yet another objective of the present exemplary embodiment is to provide a camera module wherein the warping phenomenon of a substrate is inhibited.

Still another objective of the present exemplary embodiment is to provide a vehicle camera comprising the above described camera module Technical Solution As for an exemplary embodiment, a camera module comprises: a lens barrel disposed within a front body and comprising lenses; a first substrate disposed under the front body; a support member with a portion thereof disposed on the bottom surface of the first substrate; and a second substrate disposed under the first substrate and coupled with the support member, wherein the support member comprises a fence portion disposed between the first substrate and the second substrate, and a hook portion extending from the fence portion and having a coupling hole into which some part of a side surface of the second substrate is inserted and an extended portion inclined at a predetermined angle from an area wherein the coupling hole is formed. The hook portion may be extended from the lower end of the fence portion, and the coupling hole may be coupled with a protrusion formed on an outer circumferential surface of the second substrate.

Each of the first substrate and the second substrate may comprise a first side surface, a second side surface, a third side surface, and a fourth side surface, respectively, wherein the first side surface of the first substrate and the first side surface of the second substrate may be connected through FPCB, and wherein the hook portion may comprise a first hook coupled to the second side surface of the second substrate, and a second hook coupled the third side surface of the second substrate, and a third hook coupled to the fourth side surface of the second substrate.

The upper end of the fence portion may be joined to the lower surface of the first substrate using an adhesive material.

A plurality of substrates may further comprise a third substrate spaced apart from the lower side of the second substrate, wherein the support member may comprise a first support member coupled to the first substrate and the second substrate, and a second support member coupled to the second substrate and the third substrate, and wherein the inner space formed by a fence portion of the first support member, the lower surface of the first substrate, and the upper surface of the second substrate may be wider than the inner space formed by the fence portion of the second support member, the lower surface of the second substrate, and the upper surface of the third substrate.

The hook portion may comprise a first hook coupled to one surface of the substrate and a second hook coupled to the other surface of the substrate disposed at the opposite side of the one surface, wherein some portions of the first hook and the second hook may be in contact with the inner circumferential surface of the holder member.

The protrusion may be protruded outward from the outer circumferential surface of the substrate, wherein a first protruded portion and a second protruded portion being spaced apart from the protrusion and more outwardly protruded than the protrusion at both sides of the protrusion may be formed on the outer circumferential surface of the substrate.

A first sealing member may be disposed between the lens module and the front body, a second sealing member may be disposed between the front body and the rear body, a third sealing member may be disposed between the rear body and the cable, and the end of the extended portion may be located further outside than the side surface of the second substrate.

The cross-sectional area of the upper surface of the first substrate may be formed larger than the cross-sectional area of the upper surface of the second substrate, and the supporting member may not have a region more protruded upward than the upper surface of the first substrate.

As for another exemplary embodiment, a vehicle camera comprises: a lens module comprising at least one lens; a front body accommodating the lens module; a first substrate disposed below the front body; a support member having one end soldered on the lower surface of the first substrate and disposed thereon; a second substrate disposed below the first substrate and coupled to the support member; and a rear body coupled to the front body and accommodating at least a portion of the support member, wherein the support member comprises a fence portion disposed between the first substrate and the second substrate, and a hook portion extending from the fence portion and having a coupling hole into which an outer circumferential portion of the second substrate is inserted, and wherein at least a portion of the hook portion may comprise an extended portion obliquely outwardly extending from the remaining portion except for at least a portion of the fence portion or the hook portion.

Advantageous Effects

A camera module and a vehicle camera according to the present invention, the reduction in the component mounting space can be minimized despite the stacked structure wherein a plurality of substrates are stacked. Especially, the component mounting space can be increased by 30% as compared with the screw-coupling structure.

Further, the process time is minimized, since the process is simplified due to the hook coupling structure, and therefore workability and productivity can be improved.

In addition, the warping phenomenon of the substrates, which may occur during the stacking process of a plurality of substrates, can be inhibited.

In addition, the shaking of the substrate can be inhibited when the camera module vibrates.

BEST MODE

Figure 1:
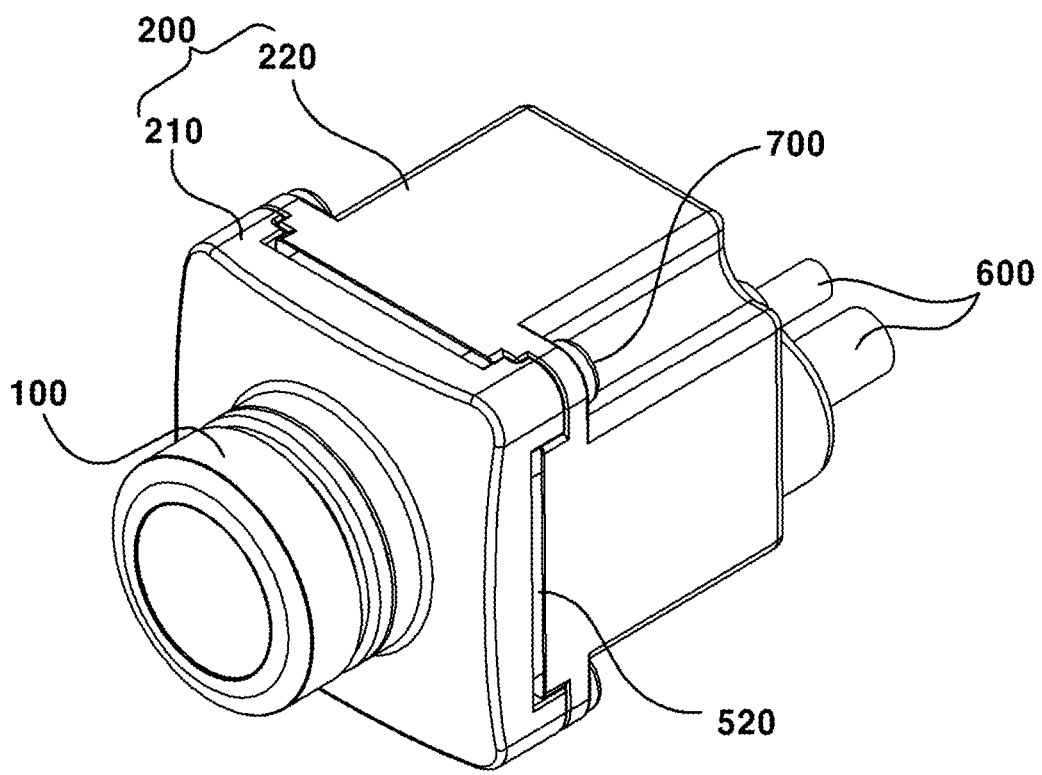
FIG. 1 is a perspective view of a camera module according to the present exemplary embodiment.

Since the present invention, which will be described below, may apply to various modifications and may have various exemplary embodiments, some specific exemplary embodiments are illustrated in the drawings and will be described in detail in the detailed description.

This, however, is by no means to restrict the invention to the specific embodiments, it is to be understood as embracing all modifications, equivalents and substitutes included in the spirit and scope of the present invention. If the specific description of the related art in the following description of the present invention that are determined to obscure the gist of the invention, the detailed description thereof is omitted.

The terms used in the present specification are merely used to describe particular exemplary embodiments, and are not intended to limit the present invention. Expressions in singular forms include plural forms unless the context clearly indicates otherwise. In this application, the terms "comprise," "have," and the like are intended to specify the features, numbers, steps, actions, components, parts, or one that exists combinations thereof described in the specification, but are not intended to preclude the one or more other features, numbers, steps, actions, components, parts, or the presence or possibility of combinations thereof.

Further, terms such as "first", "second" may be used to separately describe various elements, but the above elements shall not be restricted to the above terms. These terms are only used to distinguish one element from the other.

Hereinafter, the configuration of a camera module according to the present exemplary embodiment will be described with reference to the drawings. The configurations of a camera module according to another exemplary embodiment and a camera module according to yet another exemplary embodiment of the present invention will also be described with a focus on differences from the configuration of the camera module according to this exemplary embodiment.

Figure 2:
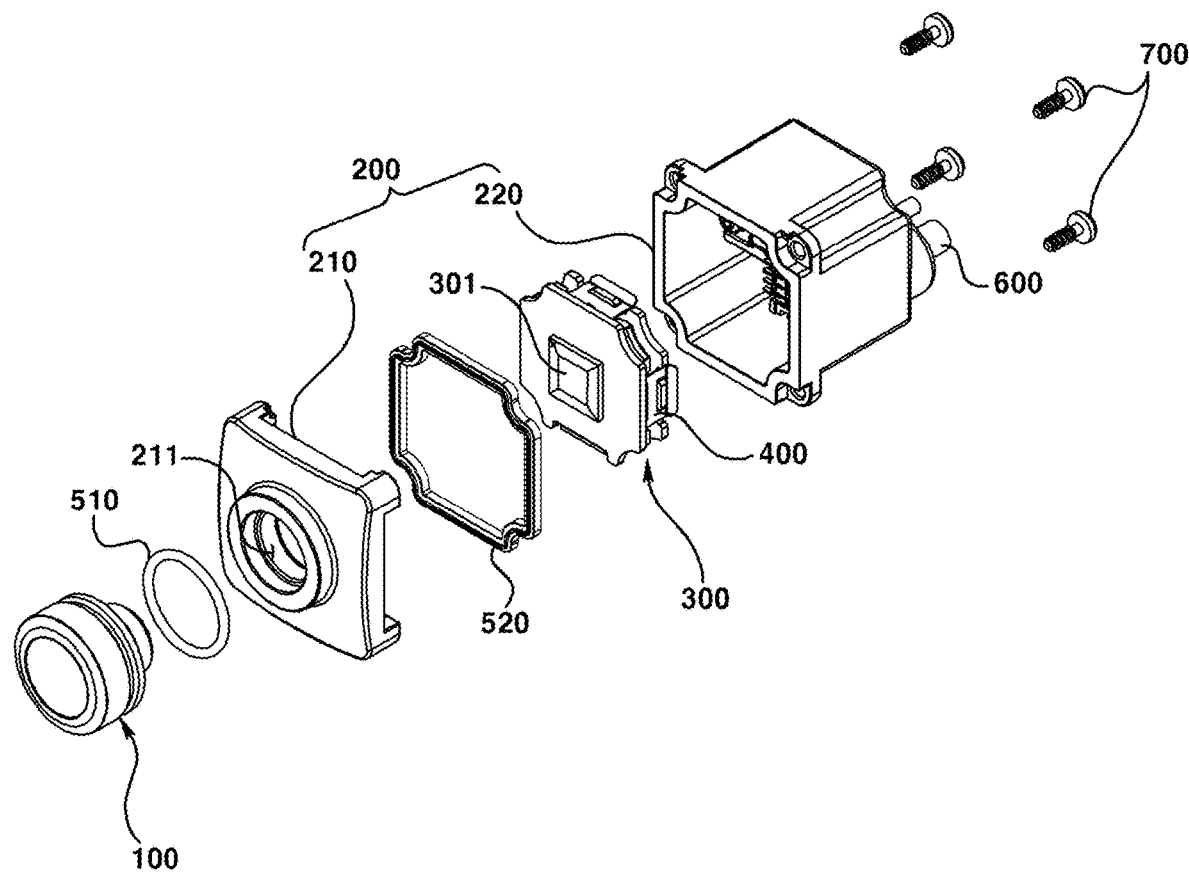
FIG. 2 is an exploded perspective view of a camera module according to the present exemplary embodiment.
Figure 3:
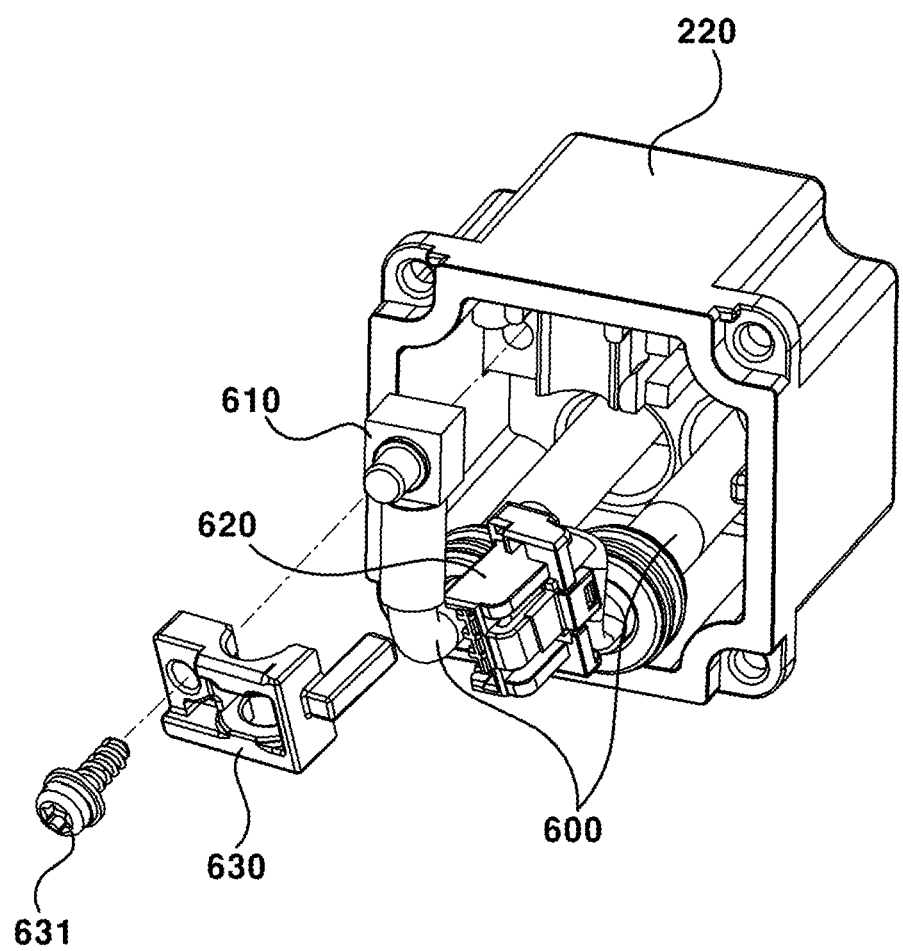
FIG. 3 is an exploded perspective view of a part of the camera module according to the present exemplary embodiment.
Figure 4:
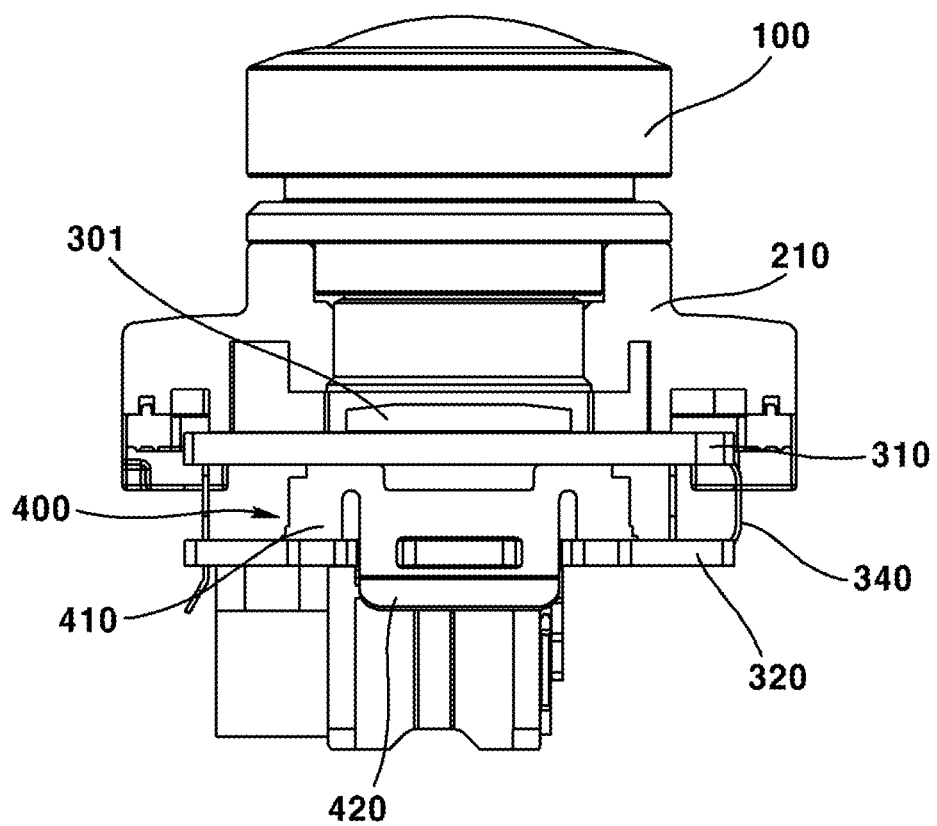
FIG. 4 is a cross-sectional view of a part of the camera module according to the present exemplary embodiment.
Figure 5:
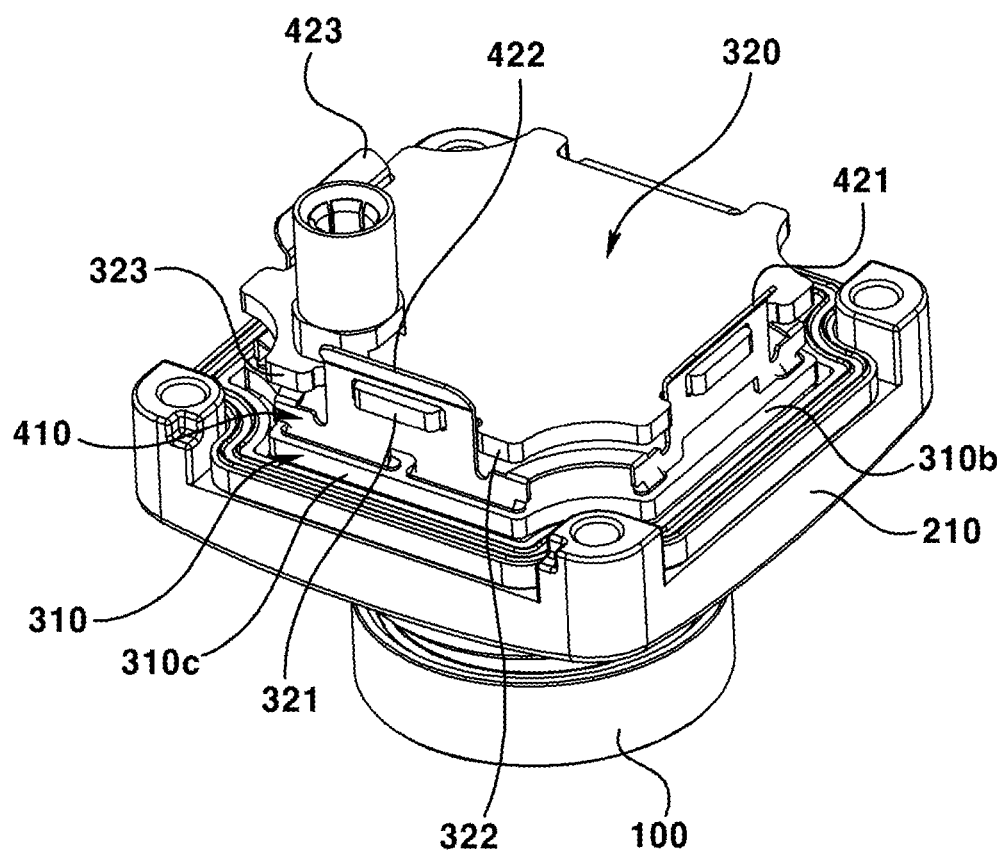
FIG. 5 is a bottom perspective view of a part of the camera module according to the present exemplary embodiment.
Figure 6:
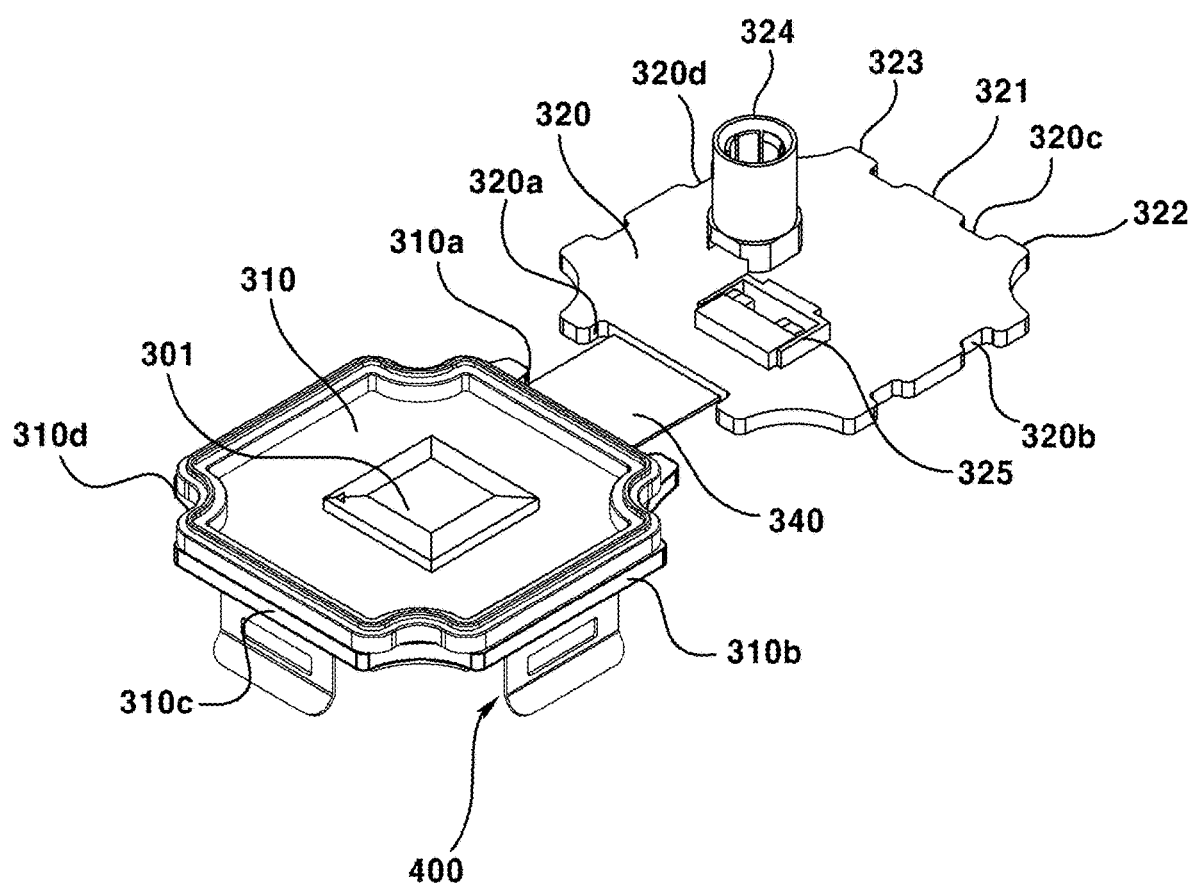
FIG. 6 is an exploded view illustrating a substrate and a support member of the camera module according to the present exemplary embodiment.
Figure 7:
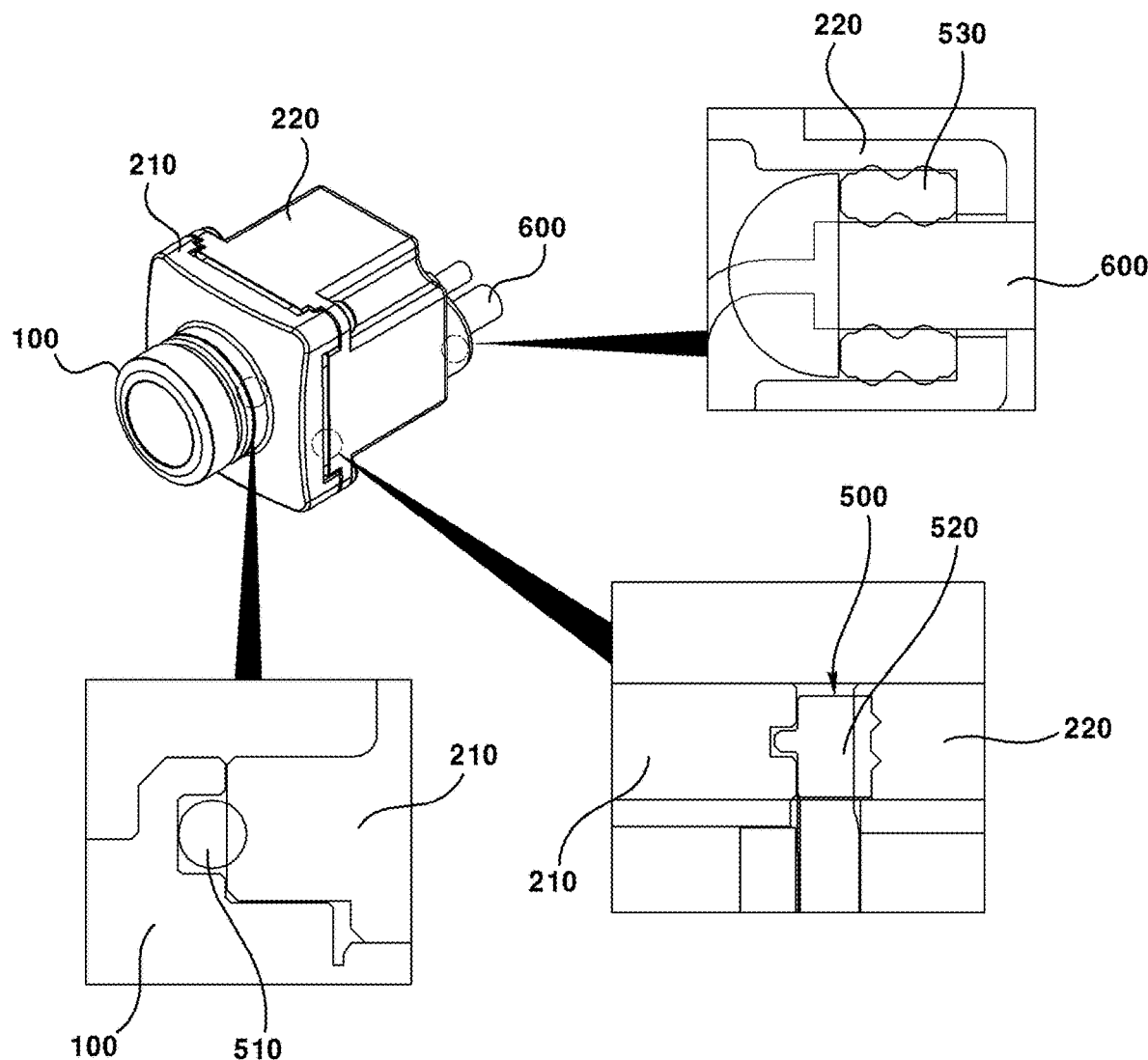
FIG. 7 is a drawing for explaining a sealing member of the camera module according to the present exemplary embodiment.

FIG. 1 is a perspective view of a camera module according to the present exemplary embodiment; FIG. 2 is an exploded perspective view of a camera module according to the present exemplary embodiment; FIG. 3 is an exploded perspective view of a part of the camera module according to the present exemplary embodiment; FIG. 4 is a cross-sectional view of a part of the camera module according to the present exemplary embodiment; FIG. 5 is a bottom perspective view of a part of the camera module according to the present exemplary embodiment; FIG. 6 is an exploded view illustrating a substrate and a support member of the camera module according to the present exemplary embodiment; and FIG. 7 is a drawing for explaining a sealing member of the camera module according to the present exemplary embodiment.

Figure 8:
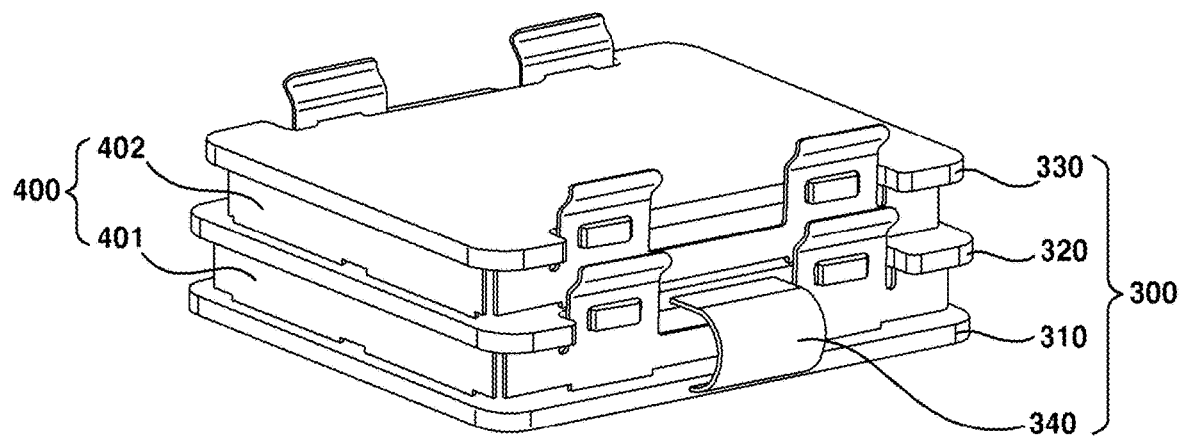
FIG. 8 is a bottom perspective view illustrating a coupling structure between a substrate and a support member of the camera module according to another exemplary embodiment of the present invention.
Figure 9:
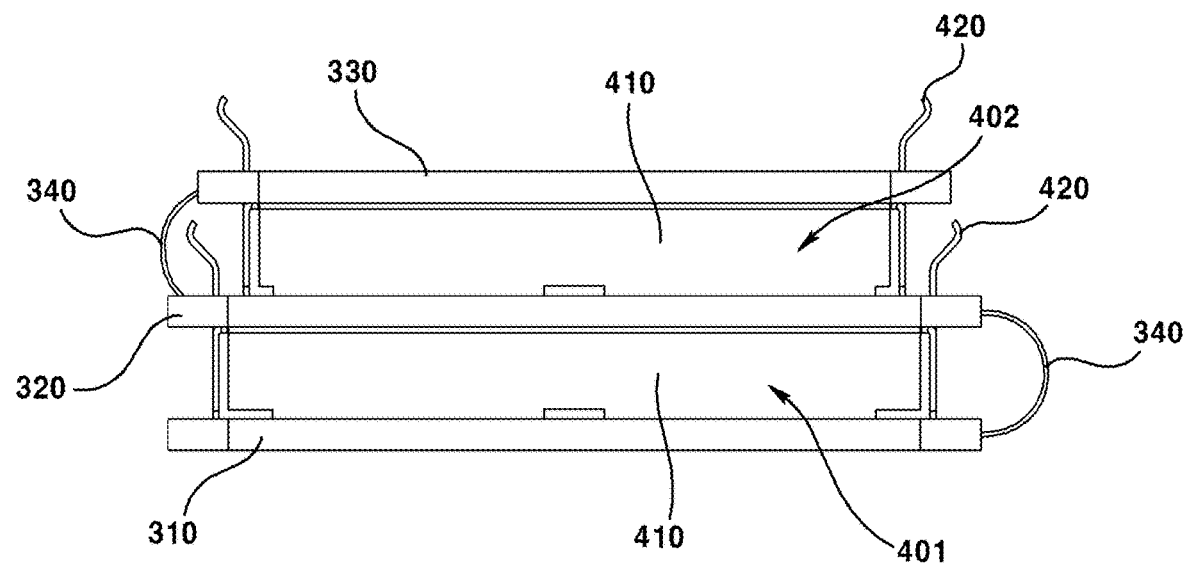
FIG. 9 is a side view of a coupling structure between the substrate and the support member in FIG. 8 when viewing from the side.
Figure 10:
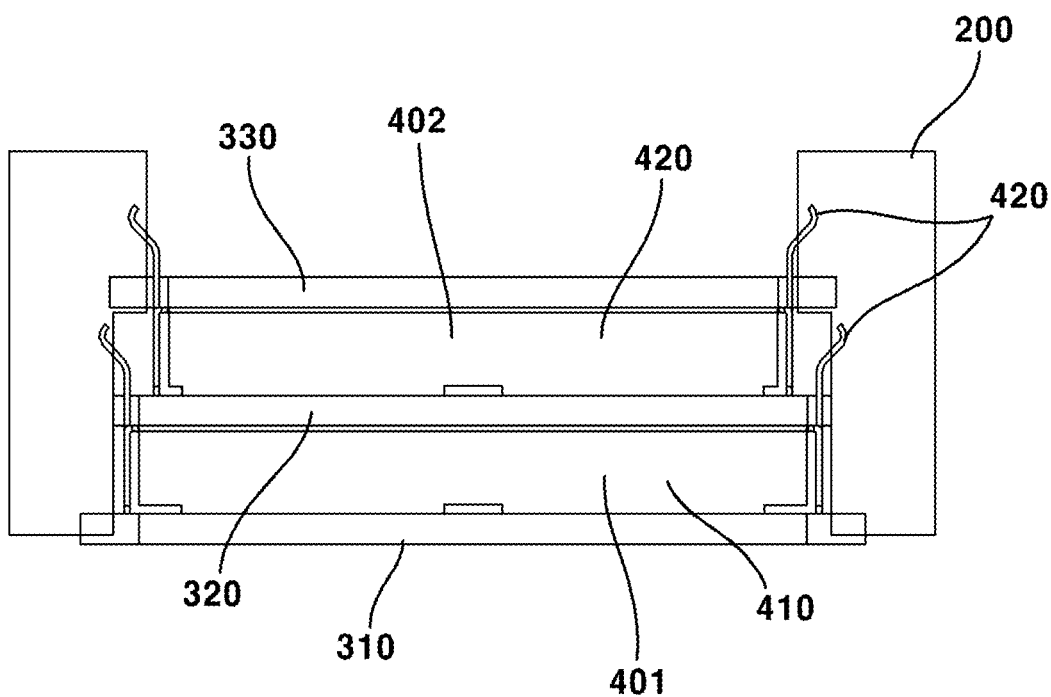
FIG. 10 is a cross-sectional view illustrating a structure wherein the substrate and the support member in FIG. 9 are disposed inside the holder member.
Figure 11:
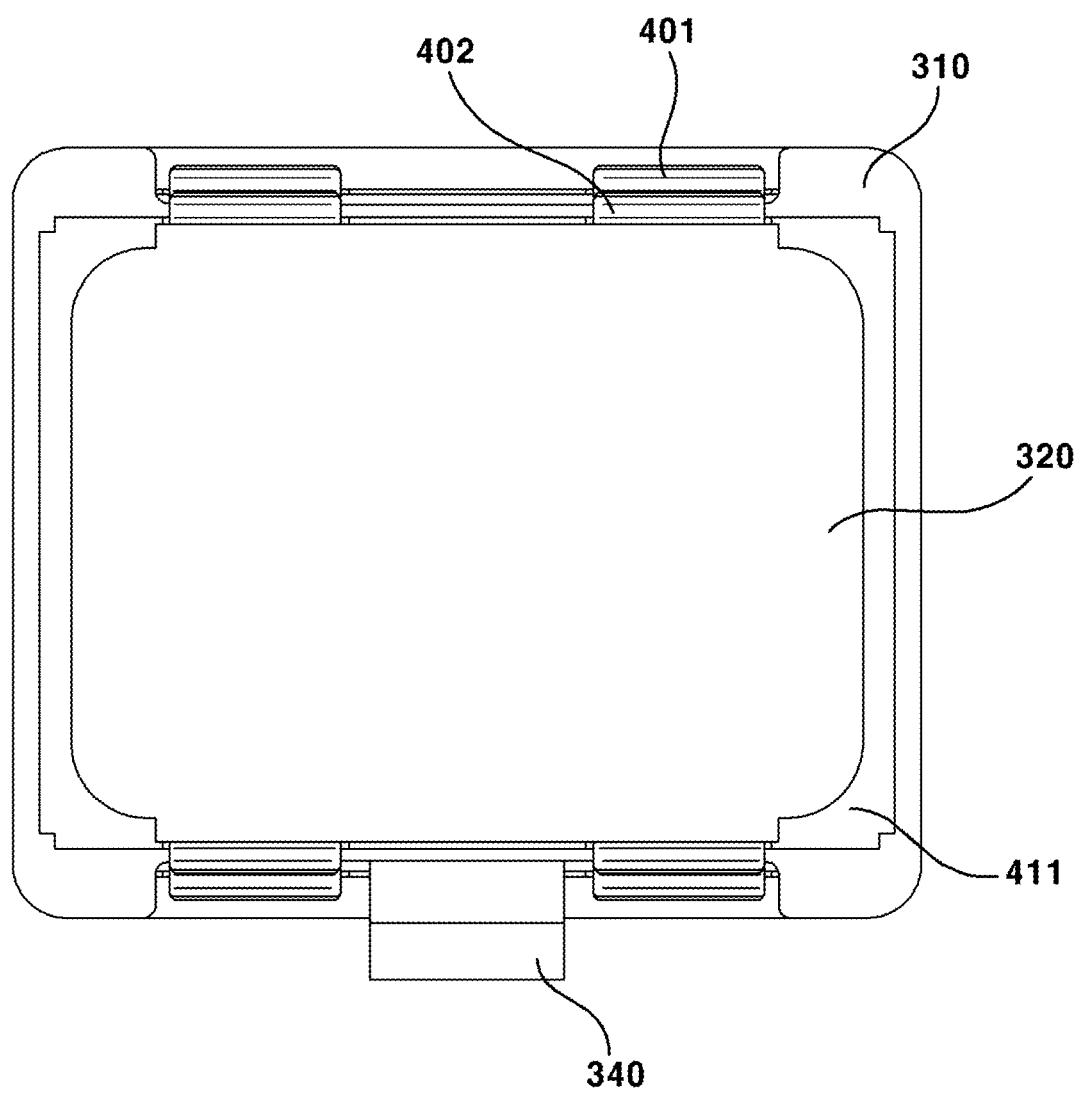
FIG. 11 is a bottom view illustrating a coupling structure between the substrate and the support member in FIG. 8 wherein the third substrate is omitted.
Figure 12:
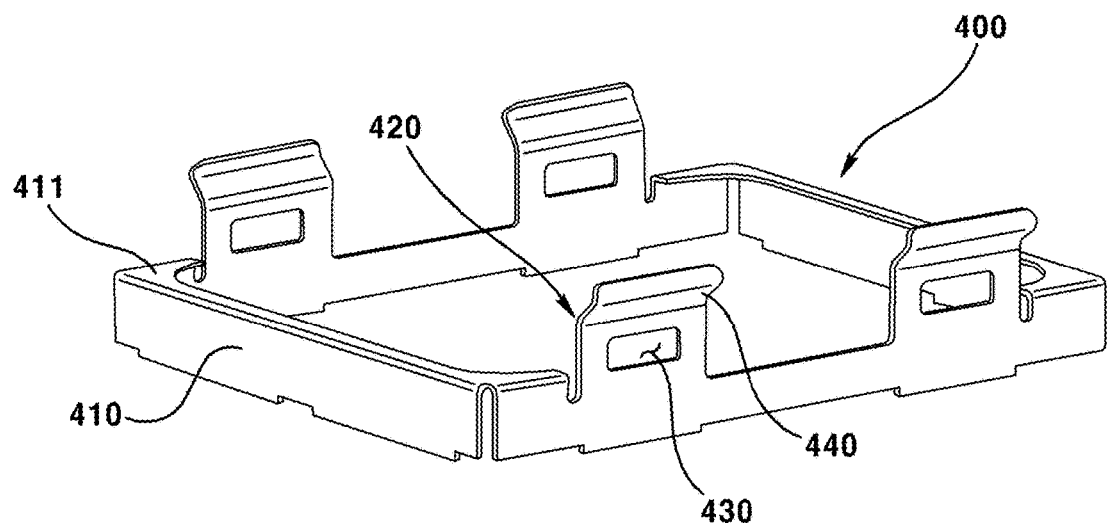
FIG. 12 is a bottom perspective view illustrating a support member in FIG. 8.
Figure 13:
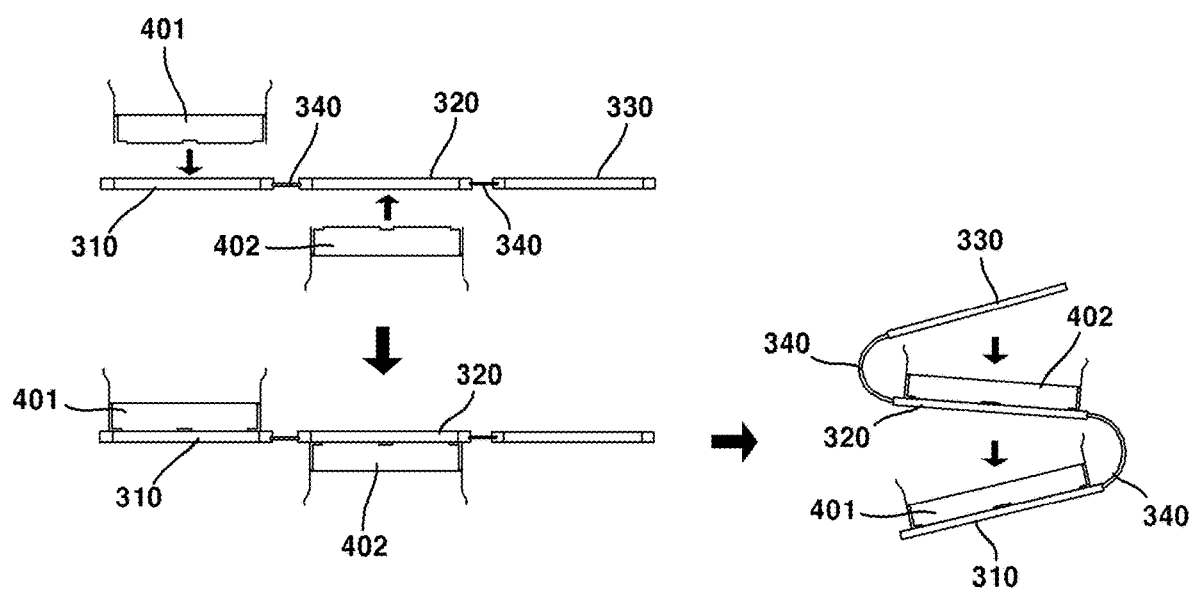
FIG. 13 is a conceptual diagram illustrating a method of coupling a substrate and a supporting member of a camera module according to another exemplary embodiment of the present invention.

FIG. 8 is a bottom perspective view illustrating a coupling structure between a substrate and a support member of the camera module according to another exemplary embodiment of the present invention; FIG. 9 is a side view of a coupling structure between the substrate and the support member in FIG. 8 when viewing from the side; FIG. 10 is a cross-sectional view illustrating a structure wherein the substrate and the support member in FIG. 9 are disposed inside the holder member; FIG. 11 is a bottom view illustrating a coupling structure between the substrate and the support member in FIG. 8 wherein the third substrate is omitted; FIG. 12 is a bottom perspective view illustrating a support member in FIG. 8; and FIG. 13 is a conceptual diagram illustrating a method of coupling a substrate and a supporting member of a camera module according to another exemplary embodiment of the present invention.

Figure 14:
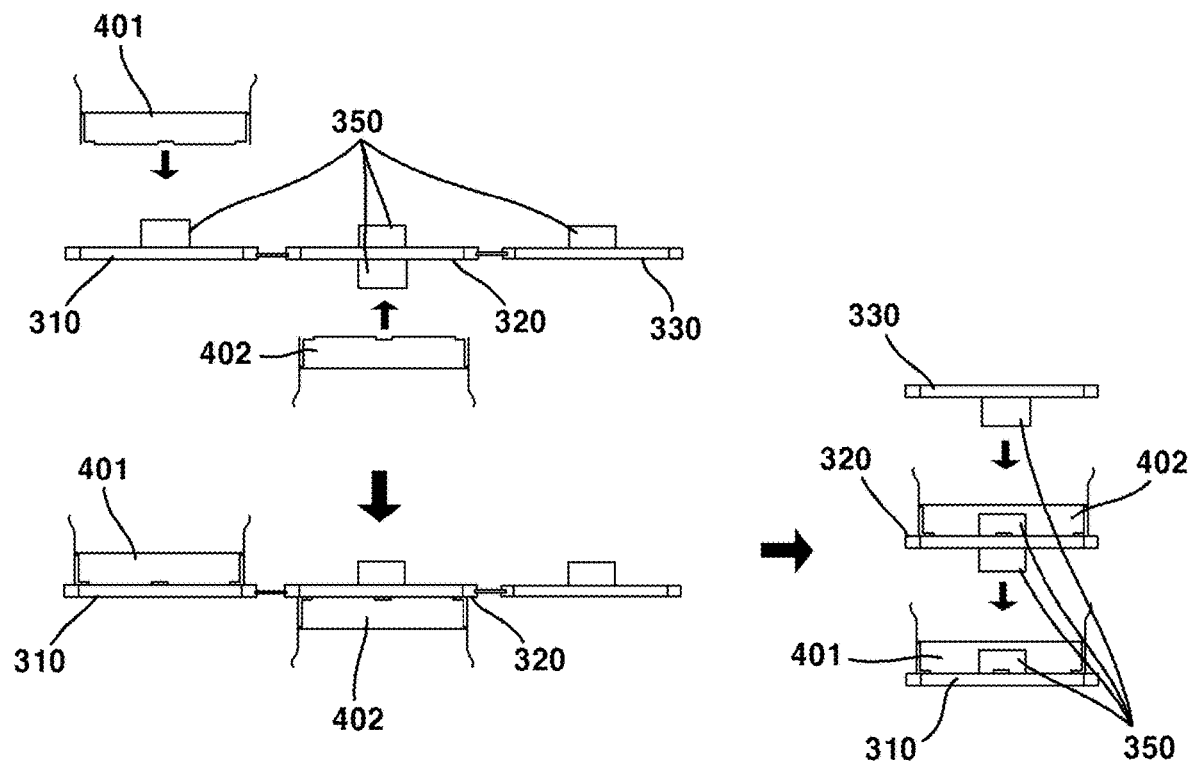
FIG. 14 is a conceptual diagram illustrating a method of assembling a substrate and a supporting member of a camera module according to yet another exemplary embodiment of the present invention.

FIG. 14 is a conceptual diagram illustrating a method of assembling a substrate and a supporting member of a camera module according to yet another exemplary embodiment of the present invention.

The camera module according to the present exemplary embodiment may comprise: a lens module 100; a holder member 200; a substrate unit 300; a supporting member 400; a sealing member 500; a cable 600; and a coupling member 700. However, in the camera module according to the present exemplary embodiment, at least any one of the lens module 100, the holder member 200, the substrate unit 300, the supporting member 400, the sealing member 500, the cable 600, and the coupling member 700 may be omitted or changed. Particularly, the sealing member 500, the cable 600, and the coupling member 700 in the camera module according to the present exemplary embodiment may be omitted.

The lens module 100 may comprise at least one lens. The lens module 100 may comprise a plurality of lenses. The lens module 100 may comprise a lens and a lens barrel to which the lens is coupled. The lens module 100 may be coupled to the holder member 200. A first sealing member 510 may be disposed between the lens module 100 and the holder member 200. The lens module 100 may be coupled to the through hole 211 of the front body 210 of the holder member 200. A light that has passed through the lens module 100 may be incident on an image sensor 301. The lens module 100 may be coupled to the holder member 200 using an adhesive. At this time, the adhesive may be epoxy. Epoxies can be cured by ultraviolet (UV) and heat. As for an example, the optical axis alignment of the image sensor 301 is adjusted in a state where an epoxy is applied between the lens module 100 and the holder member 200, and once the adjustment of the optical axis alignment is completed, the epoxy can be pre-cured through ultraviolet rays and then heated in an oven to progress the final curing. The holder member 200 can be coupled to the lens module 100. The holder member 200 can accommodate a plurality of substrates 310 and 320 inside thereof. The holder member 200 can accommodate the substrate unit 300 inside. The holder member 200 may comprise an inner space. At this time, a part of the lens module 100 and the substrate unit 300 may be disposed in the inner space of the holder member 200. The holder member 200 together with the lens module 100 can form an appearance of the camera module. The holder member 200 may have an approximately hexahedral shape. However, the shape of the holder member 200 is not limited thereto.

The holder member 200 may comprise a front body 210 and a rear body 220. However, at least any one of the front body 210 or the rear body 220 may be omitted or changed from the holder member 200. That is, the holder member 200 may be integrally formed. The front body 210 and the rear body 220 may be coupled to form an inner space. A second sealing member 520 may be disposed between the front body 210 and the rear body 220. The front body 210 and the rear body 220 may be coupled by the coupling member 700.

The front body 210 may be coupled to the lens module 100. The front body 210 may be coupled to the rear body 220. The lower end of the front body 210 may be coupled with the upper end of the rear body 220. The front body 210 may be formed of a metallic material. At this time, the front body 210 may be referred to as "EMI (Electro Magnetic Interference) shield can." The EMI shield can may inhibit the electromagnetic interference noise generated from the outside of the holder member 200 from introducing into the inside. Also, the EMI shield can may inhibit the electromagnetic interference noise generated inside the holder member 200 from leaking out to the outside.

The front body 210 may comprise a through hole 211. The lens module 100 may be coupled to the through hole 211 of the front body 210. The lens module 100 may be inserted into the through hole 211 of the front body 210. The through hole 211 may have a circular shape as viewed from above. However, the shape of the through hole 211 is not limited thereto.

The rear body 220 may be coupled to the front body 210. The rear body 220 may be formed to penetrate the cable 600 electrically connected to the plurality of substrates 310 and 320. The rear body 220 may comprise a through hole wherein the cable 600 is penetrating through. A third scaling member 530 may be disposed between the rear body 220 and the cable 600. The rear body 220 may be formed of a metallic material. At this time, the rear body 220 may be referred to as "EMI (Electro Magnetic Interference) shield can." The EMI shield can may inhibit the electromagnetic interference noise generated from the outside of the holder member 200 from introducing into the inside. Also, the EMI shield can may inhibit the electromagnetic interference noise generated inside the holder member 200 from leaking out to the outside.

The substrate unit 300 may comprise a plurality of substrates 310 and 320. The plurality of substrates 310 and 320 may be accommodated inside the holder member 200. The plurality of substrates 310 and 320 may be supported by the support member 400 so as to be spaced apart from each other. The plurality of substrates 310 and 320 may be stacked so as to overlap each other along the optical axis direction.

The substrate unit 300 may comprise a first substrate 310, a second substrate 320, and an FPCB 340. However, at least any one of the first substrate 310, the second substrate 320, and the FPCB 340 may be omitted or changed in the substrate unit 300.

The first substrate 310 may be a printed circuit board (PCB). The first substrate 310 may be coupled to an image sensor 301. The image sensor 301 may be disposed on the upper surface of the first substrate 310. The first substrate 310 may be spaced apart from the second substrate 320. A fence portion 410 may be coupled to the lower surface of the first substrate 310. The first substrate 310 may be electrically connected to the second substrate 320. The first substrate 310 may have a rectangular plate shape. The area of the upper surface of the first substrate 310 may be larger than the area of the upper surface of the second substrate 320.

The first substrate 310 may comprise four side surfaces. The first substrate 310 may comprise first to fourth side surfaces 310a, 310b, 310c, and 310d. The first side surface 310a of the first substrate 310 may be connected to the FPCB 340. Curved surfaces may be disposed between the adjacent side surfaces of the first to fourth side surfaces 310a, 310b, 310c, and 310d of the first substrate 310. That is, the first to fourth side surfaces 310a, 310b, 310c, and 310d of the first substrate 310 may be connected by the curved surfaces.

The second substrate 320 may be a printed circuit board (PCB). The second substrate 320 may be disposed on the lower side of the first substrate 310 spaced apart therefrom. A support surface 411 of the fence portion 410 may be disposed on the upper surface of the second substrate 320. A hook portion 420 may be coupled to the outer circumferential surface of the second substrate 320. The second substrate 320 may be electrically connected to the first substrate 310. The second substrate 320 may have a rectangular plate shape. The area of the upper surface of the second substrate 320 may be smaller than the area of the lower surface of the first substrate 310. The second substrate 320 may be smaller than the first substrate 310.

The second substrate 320 may comprise four side surfaces. The second substrate 320 may comprise first to fourth side surfaces 320a, 320b, 320c, and 320d. The first side surface 320a of the second substrate 320 may be connected to the FPCB 340. The hook portions 420 of the support member 400 may be coupled to the second to fourth side surfaces 320b, 320c, and 320d of the second substrate 320. Curved surfaces may be disposed between the adjacent side surfaces of the first to fourth side surfaces 320a, 320b, 320c, and 320d of the second substrate 320. That is, the first to fourth side surfaces 320a, 320b, 320c, and 320d of the second substrate 320 may be connected by the curved surfaces.

The second substrate 320 may comprise a protrusion 321, a first protruded portion 322, and a second protruded portion 323. However, at least any one of the protrusion 321, the first protruded portion 322, and the second protruded portion 323 may be omitted or changed from the second substrate 320.

The protrusion 321 may be coupled to a coupling hole 430 of the support member 400. The protrusion 321 can be hook-coupled to the hook portion 420 of the support member 400. The protrusion 321 may be coupled to the coupling hole 430 formed in the hook portion 420 of the support member 400. The protrusion 321 may be inserted into the coupling hole 430 formed in the hook portion 420 of the support member 400. The protrusion 321 may protrude outward from the outer circumferential surface of the second substrate 320. The protrusion 321 may have a shape corresponding to the coupling hole 430. The protrusion 321 may have an approximately rectangular parallelepiped shape. The width of the protrusion 321 may be wider than the width of the first protruded portion 322. The width of the protrusion 321 may be wider than the width of the second protruded portion 323. The protrusion 321 may be formed on the second to fourth side surfaces 320b, 320c, and 320d of the second substrate 320.

The first protruded portion 322 and the second protruded portion 323 may be formed at both sides of the protrusion 321 on the outer circumferential surface of the second substrate 320 spaced apart from the protrusion 321. The first protruded portion 322 and the second protruded portion 323 may be more outwardly protruded than the protrusion 321 on the outer circumferential surface of the second substrate 320. The width of each of the first protruded portion 322 and the second protruded portion 323 may be narrower than the width of the protrusion 321.

The second substrate 320 may further comprise a coupling unit 324 and a connector 325. The coupling unit 324 may be disposed on the lower surface of the second substrate 320. The coupling unit 324 may be coupled to a coupling portion 610 attached on the cable 600. In this way, the second substrate 320 can be electrically connected with the cable 600. For example, current may be supplied to the second substrate 320 through the coupling unit 324. The coupling unit 324 may have a hollow cylindrical shape. For example, the coupling pin of the coupling unit 610 formed in the cable 600 may be accommodated inside the hollow space of the coupling unit 324.

The connector 325 may be disposed on the lower surface of the second substrate 320. A connector 620 disposed on the cable 600 may be coupled to the connector 325. In this way, the second substrate 320 can be electrically connected with the cable 600. For example, the second substrate 320 can transmit and receive information (data, control commands, etc.) to and from the external configuration through the connector 325.

In the present exemplary embodiment, it is described that the protrusion 321, the first protruded portion 322, and the second protruded portion 323 are formed on the outer circumferential surface of the second substrate 320. However, it may also be described in a way that a recessed portion formed recessed from the outer circumferential surface of the second substrate 320, and corresponding to a portion between the protrusion 321 and the first protruded portion 322 and the second protruded portion 323, exists. The recessed portion may be formed between the projection 321 and the first protruded portion 322. The recessed portion may be formed between the projection 321 and the second protruded portion 323. At this time, a part of the hook portion 420 of the support member 400 may be accommodated in the recessed portion. Meanwhile, the protrusion 321 may be described as being recessed inwardly with respect to the first protruded portion 322, and the second protruded portion 323.

The FPCB 340 can electrically connect the plurality of substrates 310 and 320. At this time, the plurality of substrates 310 and 320 may be a rigid printed circuit board (RPCB), and the FPCB 340 may be a flexible printed circuit board (FPCB). That is, the plurality of substrates 310 and 320 and the FPCB 340 may be formed of rigid flexible PCB (RFPCB). The FPCB 340 may electrically connect the first substrate 310 and the second substrate 320. The FPCB 340 may be coupled to the first surface 310a of the first substrate 310 and the first surface 320a of the second substrate 320. The FPCB 340 may have flexibility at least in part. That is, the FPCB 340 can be bent. The FPCB 340 may be bent at least once. The FPCB 340 may be bent to form a curved surface at least in part. For example, the FPCB 340 may be bent roundly. Alternatively, the FPCB 340 may be bent with an angle.

The support member 400 may be coupled to the plurality of substrates 310 and 320. The support member 400 may be coupled to the substrate unit 300. The support member 400 may support the plurality of substrates 310 and 320 so as to be spaced apart from each other. The support member 400 may be formed of a metal. At this time, the support member 400 can perform the EMI shielding function. The support member 400 may have elasticity at least in part. In this case, the support member 400 may be referred to as an "elastic member." The support member 400 may comprise a hook-coupled structure. The support member 400 can be used in a three-layer or more substrate stacking structure with a hook-coupled structure. The supporting member 400 also facilitates a structure wherein a large number of substrates are required.

The support member 400 may comprise a fence portion 410, a hook portion 420, a coupling hole 430, and a guide portion 440. At least any one of the fence portion 410, the hook portion 420, the coupling hole 430 and the guide portion 440 may be omitted or changed in the support member 400.

The fence portion 410 may be disposed between the plurality of substrates 310 and 320. The fence portion 410 may be coupled to the first substrate 310. The fence portion 410 may be coupled to the first substrate 310 sing surface mounting technology (SMT). The upper end of the fence portion 410 may be coupled to the lower surface of the first substrate 310. The upper end of the fence portion 410 may be coupled to the lower surface of the first substrate 310 by soldering. The hook portion 420 may be formed at the lower end of the fence portion 410. The fence portion 410 may comprise four side plates. The inner space formed by the fence portion 410 may have a rectangular parallelepiped shape. The fence portion 410 may be formed in a shape corresponding to the plurality of substrates 310 and 320. The fence portion 410 may be coupled to a portion of the lower surface of the first substrate 310 adjacent to the outer circumferential surface. With this structure, it is possible to minimize the component mounting space reduction phenomenon on the first substrate 310.

The fence portion 410 may comprise a support surface 411. The support surface 411 can support the second substrate 320. The support surface 411 may be in surface contact with the upper surface of the second substrate 320. The support surface 411 may be formed by bending at a right angle from the side plate of the fence portion 410. The support surface 411 may be formed by bending inward from the side plate of the fence portion 410. The support surface 411 may be formed only on a portion of the side plate of the fence portion 410.

The hook portion 420 may extend from the fence portion 410. The hook portion 420 may extend from the lower end of the fence portion 410. The hook portion 420 may comprise an extended portion extending from the fence portion and inclined at a predetermined angle from a region where a coupling hole into which a side portion of the second substrate is inserted and an area where the coupling hole is formed. The upper end of the fence portion may be engaged with the lower surface of the first substrate by an adhesive material. The end of the extended portion may be located further outside than the side surface of the second substrate. The support member may not have an area more protruded above the upper surface of the first substrate. At least a portion of the hook portion 420 may extend obliquely outwardly as it extends from the fence portion 410 to the distal end side of the hook portion 420. At this time, a portion extending from the fence portion 410 to the distal end side of the hook portion 420 so as to be inclined outwardly may be referred to as a guide portion 440. The hook portion 420 may have elasticity. The hook portion 420 may be hook-coupled to the protrusion 321 of the second substrate 320 by elasticity.

The protrusion 321 of the second substrate 320 may be coupled to the hook portion 420 in a sliding manner from the distal end side of the hook portion 420 towards the fence portion 410. When the sliding of the protrusion 321 of the second substrate 320 is completed, the protrusion 321 may be inserted into the coupling hole 430 to maintain a firm coupling. At this time, when the distal end of the hook portion 420 is outwardly pressed, the protrusion 321 of the second substrate 320 can be released from the coupling hole 430 formed in the hook portion 420. The guide portion 440 can guide the movement of the protrusion 321 so that the protrusion 321 can be coupled with the hook portion 420 in a sliding manner. The hook portion 420 is designed to have an overlapping structure with the holder member 200 so that the shaking of the plurality of substrates 310 and 320 during vibration can be inhibited.

The hook portion 420 may comprise a plurality of spaced apart hooks. The hook portion 420 may comprise first to third hooks 421, 422, and 423 spaced from each other. However, at least any one of the first to third hooks 421, 422, and 423 may be omitted or changed in the hook portion 420.

The first hook 421 may be coupled to the second side surface 320*b* of the second substrate 320. The first hook 421 may be coupled with one surface of the second substrate 320. The first hook 421 can be in contact with the inner circumferential surface of the holder member 200. At this time, the third hook 423 disposed on the opposite side of the first hook 421 may also be in contact with the inner circumferential surface of the holder member 200. With such a structure, the first hook 421 can be tightly fixed within the holder member 200. The first hook 421 may be formed in a shape corresponding to the second and third hooks 422 and 423.

The second hook 422 may be coupled to the third side surface 320*c* of the second substrate 320. The second hook 422 can be in contact with the inner circumferential surface of the holder member 200.

The third hook 423 may be coupled to the fourth side surface 320*d* of the second substrate 320. The third hook 423 may be coupled to the other surface of the second substrate 320 that is disposed on the opposite side of the one surface, the surface to which the first hook 421 is coupled, of the second substrate 320. The third hook 423 can be in contact with the inner circumferential surface of the holder member 200.

The FPCB 340 may be coupled to one side surface of the four side surfaces of the second substrate 320 and the hook portion 420 may be coupled to the remaining three side surfaces. That is, the hook portion 420 may be coupled to only three of four side surfaces of the second substrate 320.

The coupling hole 430 may be formed to penetrate the hook portion 420. The coupling hole 430 may be coupled with the protrusion 321 formed on the outer circumferential surface of the second substrate 320. The protrusion 321 may be inserted into the coupling hole 430. The coupling hole 430 may be formed in a shape corresponding to the protrusion 321. As an alternative way, the coupling hole 430 may be formed as a groove. That is, the coupling hole 430 may be formed so as to accommodate the protrusion 321 but not to penetrate the hook portion 420.

The guide portion 440 may be formed on at least a portion of the hook portion 420. The guide portion 440 may be formed to extend outwardly from the fence portion 410 toward the distal end of the hook portion 420. The guide portion 440 may guide the movement of the second substrate 320 during the process of coupling the second substrate 320 to the support member The guide portion 440 may be formed inclined inward as it travels from the distal end of the hook portion 420 towards the fence portion 410. In this case, when the second substrate 320 is pressed from the distal end of the hook portion 420 towards the fence portion 410, the protrusion 321 of the second substrate 320 can be moved up to the coupling holes 430 guided by the guide portion 440. The guide portion 440 may function as a grip portion gripped by the user in the process of gripping the second substrate 320 from the support member 400.

The sealing member 500 can inhibit foreign substances such as moisture from entering into the camera module from the outside. The sealing member 500 may be disposed between the structures that are separated from each other. The sealing member 500 can form a watertight seal between the components that are separated from each other. The sealing member 500 can form a hermetic seal between the components that are separated from each other. The sealing member 500 may have elasticity at least in part. In this case, the sealing member 500 may be referred to as an "elastic member."

The sealing member 500 may comprise a first sealing member 510, a second sealing member 520, and a third sealing member 530. However, at least any one of the first sealing member 510, the second sealing member 520, and the third sealing member 530 in the sealing member 500 may be omitted or changed.

The first sealing member 510 may be disposed between the lens module 100 and the front body 210. The first sealing member 510 may be disposed between the coupling surface of the lens module 100 and the front body 210. The first sealing member 510 may be disposed between the lower surface of the lens module 100 and the upper surface of the front body 210. The first sealing member 510 may be an O-ring. The lens module 100 may comprise a groove in which the first sealing member 510 is accommodated.

The second sealing member 520 may be disposed between the front body 210 and the rear body 220. The second sealing member 520 may be disposed between the coupling surface of the front body 210 and the rear body 220. The second sealing member 520 may be disposed between the lower end surface of the front body 210 and the upper end surface of the rear body 220. The second sealing member 520 may be a gasket. The front body 210 may comprise a groove in which a portion of the second sealing member 520 is accommodated. The rear body 220 may comprise a groove in which a portion of the second sealing member 520 is accommodated. At this time, a plurality of grooves may be provided for the rear body 220.

The third sealing member 530 may be disposed between the rear body 220 and the cable 600. The third sealing member 530 may be disposed in a space between the rear body 220 and the cable 600. The third sealing member 530 may be a cable seal. The cross-section of the third sealing member 530 may be dumbbell-shaped.

The cable 600 may be electrically connected to the plurality of substrates 310 and 320. The cable 600 may be electrically connected to the substrate unit 300. The cable 600 may penetrate through the rear body 220. The third sealing member 530 may be disposed between the cable 600 and the rear body 220. The cable 600 can supply power to the camera module from a power supply unit outside the camera module.

A plurality of cables 600 may be provided. A coupling portion 610 may be coupled to one end of the plurality of cables 600. A connector 620 may be coupled to the other end of the plurality of cables 600. The coupling portion 610 may be coupled to a coupling portion 324 disposed on the lower surface of the second substrate 320. The connector 620 may be coupled to a connector 325 disposed on the lower surface of the second substrate 320.

The cable 600 can be fixed to the holder member 200 by a cable fixing unit 630. The cable fixing unit 630 may comprise a shape corresponding to at least a portion of the cable 600. The cable 600 may be disposed between the cable fixing unit 630 and the holder member 200. The cable fixing unit 630 can be coupled to the holder member 200 by a coupling member 631. At this time, the coupling member 631 may be a screw.

The coupling member 700 can couple the rear body 220 and the front body 210 together. The coupling member 700 may be a screw. That is, the rear body 220 and the front body 210 can be screw-coupled. For example, the number of the coupling members 700 may be four. A groove may be formed in the rear body 220 to facilitate the process of rotating the coupling member 700. The coupling member 700 may be coupled to the front body 210 penetrating through a hole formed in the rear body 220.

In another exemplary embodiment of the present invention, the substrate unit 300 may comprise a first substrate 310, a second substrate 320, a third substrate 330, and an FPCB 340. However, at least any one of the first substrate 310, the second substrate 320, the third substrate 330, and the FPCB 340 may be omitted or changed in the substrate unit 300 according to another exemplary embodiment of the present invention. That is, in another exemplary embodiment of the present invention, the number of the substrates 310, 320, and 330 may be increased as compared with the present exemplary embodiment. Accordingly, the number of the support members 400 can also be increased.

The third substrate 330 may be a printed circuit board (PCB). The third substrate 330 may be disposed spaced apart below the second substrate 320. A supporting surface 411 of the fence portion 410 of the support member 400 may be disposed on the upper surface of the third substrate 330. The hook portion 420 may be coupled to the outer circumferential surface of the third substrate 330. The third substrate 330 may be electrically connected to the first and second substrates 310 and 320. The third substrate 330 may have a rectangular plate shape. The area of the upper surface of the third substrate 330 may be smaller than the area of the lower surface of the second substrate 320. The third substrate 330 may be smaller than the second substrate 320.

The FPCB 340 may electrically connect the second substrate 320 and the third substrate 330. At this time, the FPCB 340 may be separately provided from the one connecting the first substrate 310 and the second substrate 320. That is, a plurality of FPCBs 340 may be provided. At this time, the first FPCB connects the first substrate 310 and the second substrate 320, and the second FPCB connects the second substrate 320 and the third substrate 330. The first FPCB may be disposed on the opposite side of the second FPCB with respect to the plurality of substrates 310, 320, and 330.

In yet another exemplary embodiment of the present invention, the substrate unit 300 may comprise a first substrate 310, a second substrate 320, a third substrate 330, and a connector 350. However, in the substrate unit 300 according to yet another exemplary embodiment of the present invention, at least any one of the first substrate 310, the second substrate 320, the third substrate 330, and the connector 350 may be omitted or changed. That is, in yet another exemplary embodiment of the present invention, the FPCB 340 may be omitted and the connector 350 may be provided when compared with the present exemplary embodiment.

The connector 350 may electrically connect the first substrate 310 and the second substrate 320. The connector 350 may be provided in a pair and disposed on the lower surface of the first substrate 310 and the upper surface of the second substrate 320, respectively. The connector 350 may electrically connect the second substrate 320 and the third substrate 330. The connector 350 may be provided in a pair and disposed on the lower surface of the second substrate 320 and the upper surface of the third substrate 330, respectively. The pair of connectors 350 can electrically conduct the two substrates through mutual coupling. As for an example, connector 350 may be a B2B connector.

In another and yet another exemplary embodiments of the present invention, the support member 400 may comprise a first support member 401 and a second support member 402. However, at least any one of the first support member 401 and the second support member 402 in the support member 400 according to another and yet another exemplary embodiment of the present invention may be omitted or changed.

The first support member 401 may be coupled to the first substrate 310 and the second substrate 320. The second support member 402 may be coupled to the second substrate 320 and the third substrate 330. The first support member 401 may be coupled to a lower surface of the first substrate 310 and may be hook-coupled to a side surface of the second substrate 320. The second support member 402 may be coupled to the lower surface of the second substrate 320 and hook-coupled to the side surface of the third substrate 330. The first support member 401 may be formed in a shape corresponding to the second support member 402. The size of the first support member 401 may be larger than that of the second support member 402. Each of the first support member 401 and the second support member 402 may comprise a fence portion 410, a hook portion 420, a coupling hole 430, and a guide portion 440.

The inner space formed by the fence portion 410 of the first support member 401, may be larger than the inner space formed by the lower surface of the first substrate 310, and the upper surface of the second substrate 320 the fence portion 410 of the second support member 402, the lower surface of the second substrate 320, and the upper surface of the third substrate 330. Hereinafter, a method of combining a camera module according to another and yet another exemplary embodiment of the present invention will be described with reference to the drawings.

FIG. 13 is a conceptual diagram illustrating a method of coupling a substrate and a supporting member of a camera module according to another exemplary embodiment of the present invention; and FIG. 14 is a conceptual diagram illustrating a method of assembling a substrate and a supporting member of a camera module according to yet another exemplary embodiment of the present invention.

Another embodiment of the present invention shown in FIG. 13 comprises three substrates 310, 320, 330 and two support members 401, 402. At this time, the three substrates 310, 320, and 330 are connected by the FPCB 340.

The first substrate 310, the FPCB 340, the second substrate 320, the FPCB 340, and the third substrate 330 are sequentially disposed in a line. At this time, the first support member 401 is mounted on the lower surface of the first substrate 310 (illustrated as the upper surface in FIG. 13, but illustrated as the lower surface in the state where the substrate unit 300 is accommodated in the holder member 200) using surface mount technology (SMT). Also, the second support member 402 is coupled to the lower surface of the second substrate 320 using surface mount technology (SMT). At this time, the fence portion 410 of the first support member 401 is coupled with the first substrate 310, and the hook portion 420 is spaced apart from the first substrate 310. The fence portion 410 of the second support member 402 is coupled to the second substrate 320 and the hook portion 420 is spaced apart from the second substrate 320.

The FPCB 340 between the first substrate 310 and the second substrate 320 is then folded to couple the second substrate 320 with the hook portion 420 of the first support member 401. At this time, the guide portion 440 of the first support member 401 guides the second substrate 320 to be more smoothly coupled to the hook portion 420 of the first support member 401. More specifically, the guide portion 440 of the first support member 401 is formed such that the hook portion 420 is widened outward when the second substrate 320 is contacted and pressed by the second substrate 320. When the second substrate 320 is further pressed, the protrusion 321 of the second substrate 320 is inserted into the coupling hole 430 of the hook 420 to complete the coupling. Since the hook portion 420 elastically returns and grips the protrusion 321 of the second substrate 320 by accommodating the protrusion 321 inside the coupling hole 430, so that the coupling between the second substrate 320 and the first support member 401 can be maintained firmly.

The FPCB 340 between the second substrate 320 and the third substrate 330 is folded to couple the third substrate 330 with the hook 420 of the second support member 402. At this time, the guide portion 440 of the second support member 402 guides the third substrate 330 to the hook portion 420 of the second support member 402 more easily. More specifically, the guide portion 440 of the second support member 402 is formed such that the hook portion 420 is widened outward when the third substrate 330 is contacted and pressed by the third substrate When the third substrate 330 is further pressed, the protrusion 321 of the third substrate 330 is inserted into the coupling hole 430 of the hook portion 420 to complete the coupling. At this since the hook portion 420 is elastically returned and the protrusion 321 of the third substrate 330 is accommodated in the coupling hole 430, so that the coupling between the third substrate 330 and the second support member 402 can be maintained firmly.

Meanwhile, when a user holds the substrate unit 300, the user outwardly pushes the guide portion 440 of the second support member 402, thereby easily removing the third substrate 330 from the second support member 402. In addition, the second substrate 320 can be easily removed from the first support member 401 by outwardly pressing the guide portion 440 of the first supporting member 401. The coupling between the substrates 320 and 330 and the support member 400 can be released just by removing the protrusion 321 from the coupling hole 430.

Yet another exemplary embodiment of the present invention illustrated in FIG. 14 comprises three substrates 310, 320, and 330 and two support members 401 and 402. At this time, connectors 350 are disposed on the three substrates 310, 320, and 330.

A coupling method of a camera module according to yet another exemplary embodiment of the present invention corresponds to a coupling method of a camera module according to another embodiment of the present invention. However, there is a difference in that in the camera module according to yet another embodiment of the present invention, the first to third substrates 310, 320, and 330 are completely separated members that are completely isolated from one other prior to the coupling thereof. For reference, in another exemplary embodiment of the present invention, the first to third substrates 310, 320 and 330 are connected through the FPCB 340. In yet another embodiment of the present invention, during the process of coupling the second substrate 320 to the first support member 401 coupled to the first substrate 310, the connector 350 disposed on the second substrate 320 and the connector 350 disposed on the first substrate 310 are also coupled together. In addition, during the process of coupling the third substrate 330 to the second support member 402 coupled to the second substrate 320, the connector 350 disposed on the third connector 330 and the connector 350 disposed on the second substrate 320 are also coupled together. The first to third substrates 310, 320, and 330 are electrically connected to each other through the connector 350 while being fixed spaced apart from each other due to the first and second supporting members 401 and 402.

It should be noted that the exemplary embodiments disclosed in the drawings are merely examples of specific examples for the purpose of understanding, and are not intended to limit the scope of the present invention. It will be apparent to those skilled in the art that other modifications based on the technical spirit of the present invention are possible in addition to the exemplary embodiments disclosed herein.

What is claimed is:

1. A camera module comprising:
a lens barrel disposed within a front body and comprising lenses;
a first substrate with a portion thereof disposed under the front body;
a support member, with a portion thereof disposed on a bottom surface of the first substrate;
a second substrate disposed under the first substrate and coupled with the support member; and
a flexible printed circuit board (FPCB) electrically connecting the first substrate and the second substrate.
wherein the support member comprises a fence portion disposed between the first substrate and the second substrate, and a hook portion extending from the fence portion and having a coupling hole into which a portion of a side surface of the second substrate is inserted and an extended portion inclined at a predetermined angle from an area in which the coupling hole is formed,
wherein a lower surface of the first substrate is in contact with an upper surface of the fence portion, and an upper surface of the second substrate is in contact with a lower surface of the fence portion,
wherein the coupling hole is formed in the hook portion completely separated from the fence portion, such that the coupling hole does not overlap the fence portion in a horizontal direction parallel to the lower surface of the first substrate,
wherein the fence portion comprises a first lateral side, a second lateral side opposite to the first lateral side, a third lateral side between the first lateral side and the second lateral side, and a fourth lateral side opposite to the third lateral side,
wherein the first lateral side of the fence portion, the second. lateral side of the fence portion, the third lateral side of the fence portion, and the fourth lateral side of the fence portion are all disposed between the first substrate and the second substrate, in a vertical direction perpendicular to the horizontal direction,
wherein the hook portion extends in the vertical direction from at least one of the first lateral side of the fence portion, the second lateral side of the fence portion, the third lateral side of the fence portion, and the fourth lateral side of the fence portion,
wherein the hook portion is omitted from a lateral side, from among the first to fourth lateral sides of the fence portion, on which the FPCB is disposed, and
wherein an upper surface of the second lateral side of the fence portion, an upper surface of the third lateral side of the fence portion, and an upper surface of the fourth lateral side of the fence portion are all in contact with the lower surface of the first substrate.

2. The camera module according to claim 1, wherein the hook portion is extended from the lower surface of the fence portion, and the coupling hole is coupled with a protrusion formed on an outer circumferential surface of the second substrate.

3. The camera module according to claim 2, wherein the protrusion is protruded outward from the outer circumferential surface of the second substrate,
wherein the second substrate comprises a first protruded portion and a second protruded portion both being spaced apart from the protrusion, and
wherein the first protruded portion and the second protruded portion are both more outwardly protruded from the outer circumferential surface of the second substrate than is the protrusion.

4. The camera module according to claim 3, wherein a width of the protrusion is formed to be larger than a width of the first protruded portion or a width of the second protruded portion.

5. The camera module according to claim 1, wherein each of the first substrate and the second substrate comprises a first side surface, a second side surface, a third side surface, and a fourth side surface, respectively, wherein the first side surface of the first substrate and the first side surface of the second substrate are connected through the flexible printed circuit board (FPCB), and
wherein the hook portion comprises a first hook coupled to the second side surface of the second substrate, a second hook coupled the third side surface of the second substrate, and a third hook coupled to the fourth side surface of the second substrate.

6. The camera module according to claim 1, wherein the upper end of the fence portion is coupled to the lower surface of the first substrate using an adhesive material.

7. The camera module according to claim 1, wherein a third substrate is spaced apart from the lower side of the second substrate,
wherein the support member comprises a first support member coupled to the first substrate and the second substrate, and a second support member coupled to the second substrate and the third substrate, and
wherein a first inner space formed by a fence portion of the first support member, the lower surface of the first substrate, and the upper surface of the second substrate is wider than a second inner space formed by the fence portion of the second support member, the lower surface of the second substrate, and the upper surface of the third substrate.

8. The camera module according to claim 1, comprising a holder member comprising the front body and a rear body coupled to the front body to form an inner space in which the first substrate and second substrate are disposed,
wherein the hook portion comprises a first hook coupled to one surface of the second substrate and a second hook coupled to an other surface of the second substrate disposed at the opposite side of the one surface, and
wherein some portions of the first hook and the second hook are in contact with an inner circumferential surface of the holder member.

9. The camera module according to claim 1, wherein aaa upper end of the fence portion is soldered to the lower surface of the first substrate.

10. The camera module according to claim 1, wherein a cross-sectional area of the upper surface of the first substrate k larger than a cross-sectional area of the upper surface of the second substrate, and wherein the supporting member does not have a region more protruded upward than the upper surface of the first substrate.

11. The camera module according to claim 1, wherein the support member includes a guide portion that is inclined outwardly as it extends from the fence portion to a distal end side of the hook portion.

12. The camera module according to claim 1, wherein the fence portion is surface mounted on the first substrate.

13. The camera module according to claim 1, wherein the fence portion includes a support surface for supporting the second substrate, wherein the support surface is in surface contact with the upper surface of the second substrate, and wherein the support surface extends along an entirety of the first lateral surface of the fence portion.

14. The camera module according to claim 13, wherein the support surface is formed by being bent at a right angle from a side plate of the fence portion.

15. The camera module according to claim 13, wherein the support surface is formed by bending inward from a side plate of the fence portion.

16. A vehicle camera comprising:
a lens module comprising at least one lens;
a front body accommodating the lens module;
a first substrate disposed below the front body;
a support member having one end soldered on the lower surface of the first substrate and disposed thereon;
a second substrate disposed below the first substrate and coupled to the support member;
a flexible printed circuit board (FPCB) electrically connecting the first substrate and the second substrate; and
a rear body coupled to the front body and accommodating at least a portion of the support member,
wherein the support member comprises a fence portion disposed between the first substrate and the second substrate, and a hook portion extending from the fence portion and having a coupling hole into which an outer circumferential portion of the second substrate is inserted,
wherein at least a portion of the hook portion comprises an extended portion obliquely outwardly extending from the remaining portion except for at least a portion of the fence portion or the hook portion,
wherein a lower surface of the first substrate is in contact with an upper surface of the fence portion, and an upper surface of the second substrate is in contact with a lower surface of the fence portion,
wherein the coupling hole is formed in the hook portion completely separated from the fence portion, such that the coupling hole does not overlap the fence portion in a horizontal direction parallel to the lower surface of the first substrate,
wherein the fence portion comprises a first lateral side, a second lateral side opposite to the first lateral side, a third lateral side between the first lateral side and the second lateral side, and a fourth lateral side opposite to the third lateral side,
wherein the first lateral side of the fence portion, the second lateral side of the fence portion, the third lateral side of the fence portion, and the fourth lateral side of the fence portion are all disposed between the first substrate and the second substrate, in a vertical direction perpendicular to the horizontal direction,
wherein the hook portion extends in the vertical direction from at least one of the first lateral side of the fence portion, the second lateral side of the fence portion, the third lateral side of the fence portion, and the fourth lateral side of the fence portion,
wherein the hook portion is omitted from a lateral side, from among the first to fourth lateral sides of the fence portion, on which the FPCB is disposed, and
wherein an upper surface of the second lateral side of the fence portion, an upper surface of the third lateral side of the fence portion, and an upper surface of the fourth lateral side of the fence portion are all in contact with the lower surface of the first substrate.

17. The vehicle camera according to claim 16, comprising:
a cable that penetrates through a through hole formed in the rear body and that is electrically connected to the first substrate or the second substrate;
a first sealing member disposed between the lens module and the front body;
a second sealing member disposed between the front body and the rear body;
a third sealing member disposed between the rear body and the cable; and
an end of the extended portion located outside a side of the second substrate.

18. The vehicle camera according to claim 16, wherein the hook portion is extended from the lower surface of the fence portion, and the coupling hole is coupled with a protrusion formed on an outer circumferential surface of the second substrate.

19. The vehicle camera according to claim 16, wherein each of the first substrate and the second substrate comprises a first side surface, a second side surface, a third side surface, and a fourth side surface, respectively,
wherein the first side surface of the first substrate and the first side surface of the second substrate are connected through an FPCB, and
wherein the hook portion comprises a first hook coupled to the second side surface of the second substrate, a second hook coupled the third side surface of the second substrate, and a third hook coupled to the fourth side surface of the second substrate.

20. The vehicle camera according to claim 16, wherein a third substrate is spaced apart from the.lower side of the second substrate,
wherein the support member comprises a first support member coupled to the first substrate and the second substrate, and a second support member coupled to the second substrate and the third substrate, and
wherein a first inner space formed by a fence portion of the first support member, the lower surface of the first substrate, and the upper surface of the second substrate is wider than a second inner space formed by the fence portion of the second support member, the lower surface of the second substrate, and the upper surface of the third substrate.

* * * * *